US007348646B2

(12) United States Patent
Barzen et al.

(10) Patent No.: US 7,348,646 B2
(45) Date of Patent: Mar. 25, 2008

(54) MICROMECHANICAL CAPACITIVE TRANSDUCER AND METHOD FOR MANUFACTURING THE SAME

(75) Inventors: Stefan Barzen, Munich (DE); Alfons Dehe, Neufahrn (DE); Marc Fueldner, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/584,948

(22) Filed: Oct. 23, 2006

(65) Prior Publication Data

US 2007/0034976 A1 Feb. 15, 2007

Related U.S. Application Data

(62) Division of application No. 10/991,350, filed on Nov. 15, 2004, now Pat. No. 7,253,016.

(30) Foreign Application Priority Data

May 15, 2002 (DE) ............................... 102 21 660

(51) Int. Cl.
*H01L 29/82* (2006.01)
*H01L 21/00* (2006.01)

(52) U.S. Cl. ........................................ 257/417; 438/53

(58) Field of Classification Search ................. 438/50, 438/53; 257/415–420, E29.266–E29.278
See application file for complete search history.

(56) References Cited

U.S. PATENT DOCUMENTS 6,535,460 B2 * 3/2003 Loeppert et al. ............ 367/181
6,847,090 B2 * 1/2005 Loeppert .................... 257/418

* cited by examiner

*Primary Examiner*—Calvin Lee
(74) *Attorney, Agent, or Firm*—Maginot, Moore & Beck

(57) ABSTRACT

A micromechanical capacitive converter and a method for manufacturing a micromechanical converter comprise a movable membrane and an electrically conductive face element in a carrier layer. The electrically conductive face element is arranged opposite the membrane above a cavity. The electrically conductive face element and the carrier layer are perforated by perforation openings. The opening width of the perforation openings corresponds approximately to the thickness of the carrier layer.

14 Claims, 4 Drawing Sheets

MICROMECHANICAL CAPACITIVE TRANSDUCER AND METHOD FOR MANUFACTURING THE SAME

CROSS-REFERENCE TO RELATED APPLICATIONS

This application is a divisional of U.S. patent application Ser. No. 10/991,350, filed on Nov. 15, 2004, and issued as U.S. Pat. No. 7,253,016, which is hereby incorporated by reference for all purposes as if fully set forth herein.

FIELD

The present invention relates to a micromechanical capacitive converter and methods for manufacturing the same.

BACKGROUND

In a micromechanical capacitive converter for which a silicon microphone is an example, frequently an air-filled cavity with a small volume is present. In a microphone, this is for example an air-filled sensor capacity consisting of a sensitive membrane and a rigid counter electrode. Due to this small air volume, the enclosed air exerts a strong restoring force on the sensor membrane. The enclosed air causes a damping of the membrane deflection and reduces the sensitivity or bandwidth, respectively, of the sensor.

For increasing the bandwidth it is known to provide discharge facilities for air, wherein this is done by a perforation of the counter electrode in silicon microphones. By such a perforation, the air may escape from the capacitor gap, i.e. the cavity between the sensitive membrane and the rigid counter electrode.

Well-established commercial elecret microphones comprise geometries with dimensions so great that the rigidity of the air cushion is neglectable. These microphones have, however, not the advantages of a temperature-stable silicon microphone in mass production.

In micromechanically manufactured microphones, ones with electroplated counter-electrodes are known, wherein the counter-electrode is electroplated in the last step of the manufacturing process on the microchip. With regard to such microphones, reference is for example made to Kabir et al., High sensitivity acoustic transducers with $p^+$ membranes and gold black-plate, Sensors and Actuators 78 (1999), pages 138-142; and J. Bergqvist, J. Gobet, Capacitive Microphone with surface micromachined backplate using electroplating technology, Journal of Micromechanical Systems, Vol. 3, No. 2, 1994. In manufacturing processes for such microphones the perforation openings may be selected so large that the acoustic resistance is very small and has no influence on the damping of the membrane deflection. Disadvantageous is the expensive process of electroplating.

From the prior art, further two-chip-microphones are known, in which the membrane and the counter electrode are respectively manufactured on separate wafers. The microphone capacity is then obtained by "bonding" the two wafers. With regard to such a technology, reference is made to W. Kühnel, Kapazitive Silizium-Mikrofone, Series 10, Informatik/Kommunikationstechnik, No. 202, Fortschrittsberichte, VDI, VDI-Verlag, 1992. Dissertation; J. Bergqvist, Finite-element modeling and characterization of a silicon condenser microphone with highly perforated backplate, Sensors and Actuators 39 (1993), pages 1991-2000; and T. Bourouina et al., A new condenser microphone with a $p^+$ silicon membrane, Sensors and Actuators A, 1992, pages 149-152. Also with this type of microphone it is technologically possible to select sufficiently large diameters for the perforation openings of the counter-electrode. For cost reasons, however, one-chip solutions are preferred. In addition to that, with the two-chip microphones, the alignment of the two wafers to each other is problematic.

With the one-chip microphones, the counter-electrode is manufactured in an integrated way, i.e. only one wafer is required. The counter-electrode consists of one silicon substrate or is formed by deposition or epitaxy, respectively. Examples for such one-chip microphones are described in A. Torkkeli et al., Capacitive microphone with low-stress polysilicon membrane and high-stress polysilicon backplate, Physica Scripta, Vol. T79, 1999, pages 275-278; Kovacs et al., Fabrication of single-chip polysilicon condenser structures for microphone applications, J. Micromech. Miroeng. 5 (1995) pages 86-90; and Füldner et al., Silicon microphone with high sensitivity diaphragm using SOI substrate, Proceedings Eurosensors XIV, 1999, pages 217-220. In the manufacturing methods for those one-chip microphones it is generally required to close the generated perforation openings in the counter-electrode again for the following processing in order to balance the topology.

One manufacturing method for such one-chip microphones is known from WO 00/09440. In this manufacturing method, initially perforation openings are generated in an epitactic layer formed on a wafer. In the following, among others for generating a sacrificial layer an oxide deposition is performed on the front side of the epitaxy layer, so that on the one hand the perforation openings are closed and on the other hand a spacing layer whose thickness defines the later spacing between membrane and counter-electrode, is formed. On this layer, a silicon membrane with the required thickness is deposited then. After the required processing of the electronic devices, in the area of the perforation openings the wafer is etched from the backside up to the epitaxy layer. In the following, from the backside an etching of the oxide is performed for opening the perforation openings and the cavity between membrane and counter-electrode. One part of the sacrificial layer between membrane and epitaxy layer thus remains as a spacing layer between the membrane and the counter-electrode.

One disadvantage of this hitherto known manufacturing method for one-chip microphones is that the hole diameter in the counter-electrode may not be larger than twice the thickness of the layer deposited thereon, so that the perforation openings may still be securely closed when depositing the sacrificial layer with the desired thickness. This is disadvantageous in particular insofar as the width of the individual perforation openings may not be realized so large that the acoustic resistance and thus e.g. the top cut-off frequency of the microphone sensitivity may be optimized.

SUMMARY

It is advantageous according to at least one embodiment of the present invention to provide a high-sensitive micromechanical capacitive converter with a minimum attenuation of the membrane and a maximum bandwidth and a method for manufacturing such a micromechanical capacitive converter.

In accordance with a first aspect, at least one embodiment of the present invention provides a micromechanical capacitive converter, having a movable membrane; an electrically conductive face element, wherein the electrically conductive face element is arranged across a cavity and is opposite the membrane; and a carrier layer in which the electrically conductive face element is arranged, wherein the carrier layer and the electrically conductive face element are perforated by perforation openings, characterized in that the opening width of the perforation openings approximately corresponds to the thickness of the carrier layer.

In accordance with a second aspect, at least one embodiment of the present invention provides a method for manufacturing a micromechanical capacitive converter with the steps of providing a substrate, applying a carrier layer onto the substrate, applying a mask layer over the surface of the carrier layer facing away from the substrate, structuring the mask layer such that it comprises first openings whose smallest expansion corresponds at maximum to double the later distance between a membrane and the surface, generating perforation openings in the area below the first openings in the mask layer reaching through the carrier layer, wherein the smallest opening width of the perforation openings corresponds to more than double the later distance between the membrane and the surface, generating a substantially planar sacrificial layer over the structured mask layer with a thickness, which is dependent on the later desired distance between the carrier layer and a membrane, applying the membrane onto the substantially planar sacrificial layer, exposing at least one part of the side of the carrier layer abutting the substrate, removing the sacrificial layer and the mask layer for opening the perforation openings and for generating a cavity between the membrane and the carrier layer in which the perforation openings are formed.

In at least one embodiment, the present invention provides an arrangement and a method for manufacturing micromechanical capacitive converters, in particular microphones, but also other micromechanical capacitive converters having a cavity arranged between two faces. As an example, here acceleration sensors, pressure sensors, and the like are mentioned.

As a substantial advantage of at least one embodiment of the invention may be regarded that the processing of large perforation openings may easily be integrated in a conventional overall process for manufacturing a micromechanical capacitive converter.

In one alternative implementation of the inventive arrangement, the electrically conductive face element is arranged on the carrier layer.

In one advantageous implementation of the inventive arrangement, the smallest opening width of the perforation opening is more than 2 μm. Thereby, a decrease of the acoustic resistance is achieved.

In a further advantageous implementation of the invention, the perforation openings occupy 10% to 50% of the overall face from the interface between the cavity and the carrier layer and the interface between the cavity and the electrically conductive face element. By this dimensioning, a sufficient stability of the perforated element is guaranteed.

In an advantageous implementation of the invention, the carrier layer is deposited epitactically onto the substrate and may serve as an etch stop layer.

In the developments of the inventive method it is regarded as particularly advantageous when after applying the carrier layer an electrically conductive face element is introduced into the carrier layer or applied to the carrier layer, because this face element may then serve as an electrode in particular in a silicon microphone.

In a further advantageous embodiment, before applying the electrically conductive face element onto the carrier layer an electrically insulating layer is generated.

In a further advantageous embodiment, when generating the substantially planar sacrificial layer, the perforation openings are lined with the sacrificial layer at their interior wall. This gives additional stability to the perforation openings.

It is especially advantageous when the interior walls of the perforation openings are lined with a material, which is etching-resistant against the substrate. Thereby, a selective removing of the substrate for exposing at least one part of the side of the carrier layer abutting the substrate is enabled.

BRIEF DESCRIPTION OF THE DRAWINGS

Further embodiments of the present invention are described in detail with respect to the following figures, in which.

DESCRIPTION OF THE PREFERRED EMBODIMENTS

Figure 1:
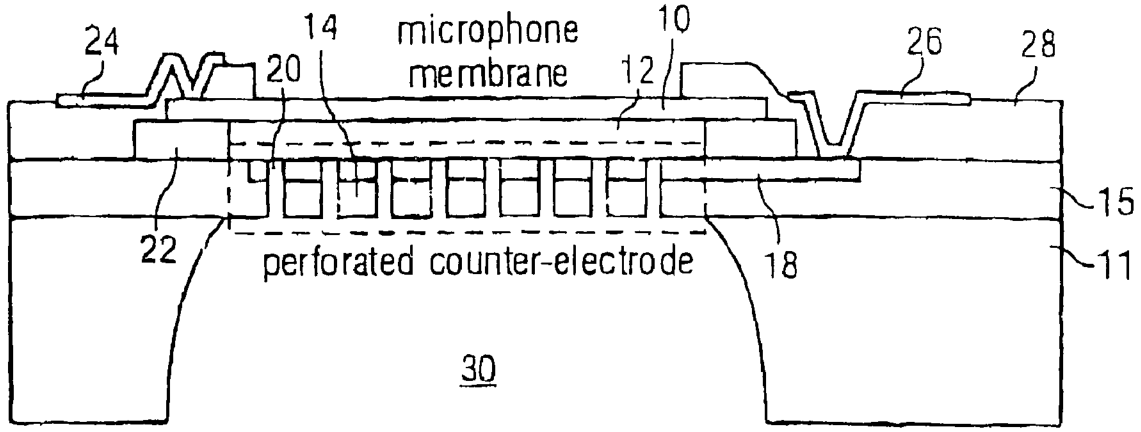
FIG. 1 shows a schematical sectional view of a micromechanical capacitive converter.

In FIG. 1, a general set-up of a one-chip silicon microphone is illustrated schematically.

The one-chip silicon microphone comprises a moveable membrane 10. The membrane 10 lies above a cavity 12 and opposite a counter-electrode 14. This counter-electrode 14 is formed by areas of an epitaxy layer 15 applied to a substrate 11. In the counter-electrode 14 a doping area 18 and perforation openings 20 are formed.

The membrane 10 is applied to the epitaxy layer 15 via a spacing layer 22. A first terminal electrode 24 is connected to the membrane 10 in an electrically conductive way, while a second terminal electrode 26 is connected to the doping area 18 of the counter-electrode 14. On the epitaxy layer 15 outside the membrane area an insulating layer 28 is provided.

In the substrate 11 below the portion of the epitaxy layer 15 serving as a counter-electrode 14 an opening 30 is provided, so that the perforation openings 20 fluidically connect the cavity 12 to the opening 30. The opening 30 may be etched into the substrate 11.

As the functioning of the illustrated capacitive converter should be obvious for a person skilled in the art, it is merely noted that by the acoustic waves hitting the membrane 10, a deformation of the membrane takes place, so that a capacity change resulting due to the changed spacing between the membrane 10 and the counter-electrode 14 may be detected between the terminal electrodes 24 and 26.

In order to reduce the influence of the air contained within the cavity 12 on the sensitivity and the response of the converter, the perforation openings 20 serving as discharge openings are provided in the counter-electrode 14. By these perforation openings 20, when the membrane is deformed, the air may escape from the capacitor gap, i.e. escape from the cavity and enter trough the same, wherein the resulting acoustic resistance determines the top cut-off frequency of the microphone sensitivity depending on the perforation density and the size of the individual perforation openings.

Figure 2:
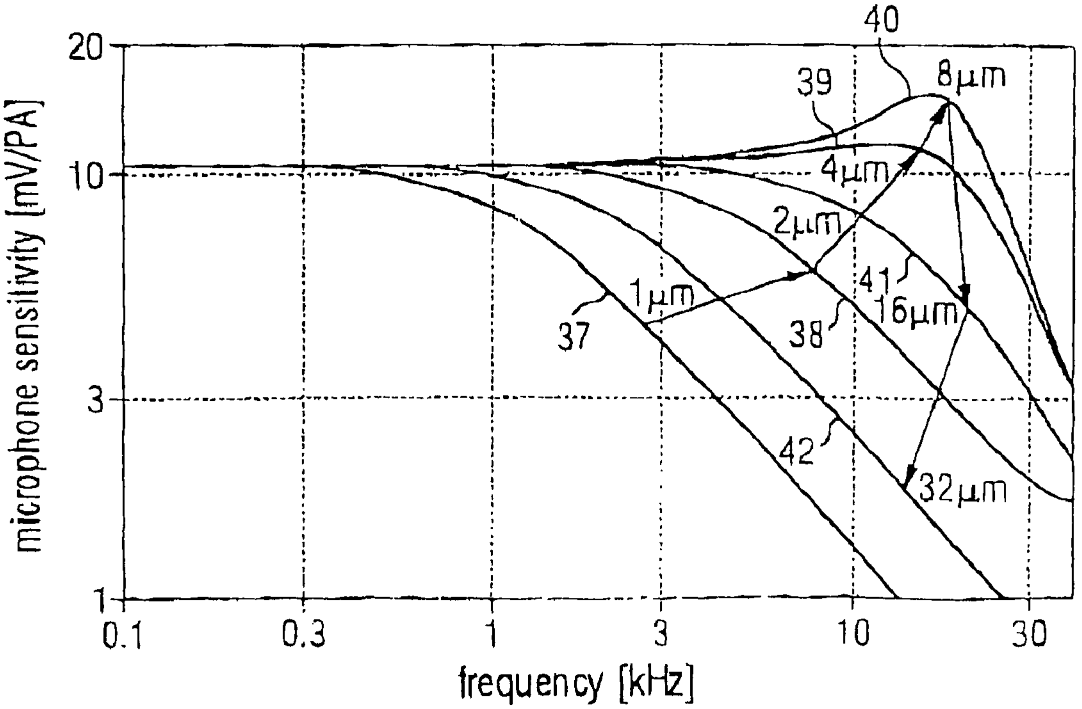
FIG. 2 shows a diagram that illustrates the dependence of the microphone sensitivity of an inventive microphone on the hole diameter of the perforation openings.
Figure 3A:
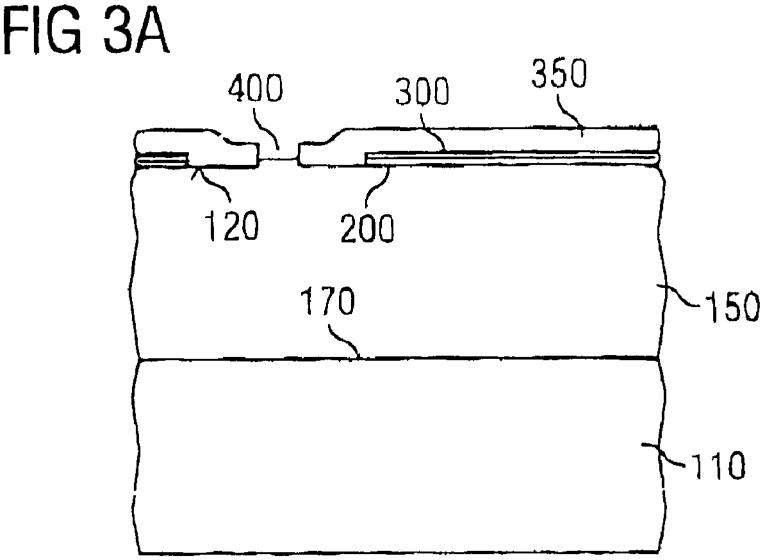
FIG. 3*a*) to 3*i*) show schematical sectional illustrations for explaining a method for manufacturing an individual perforation opening.
Figure 3B:
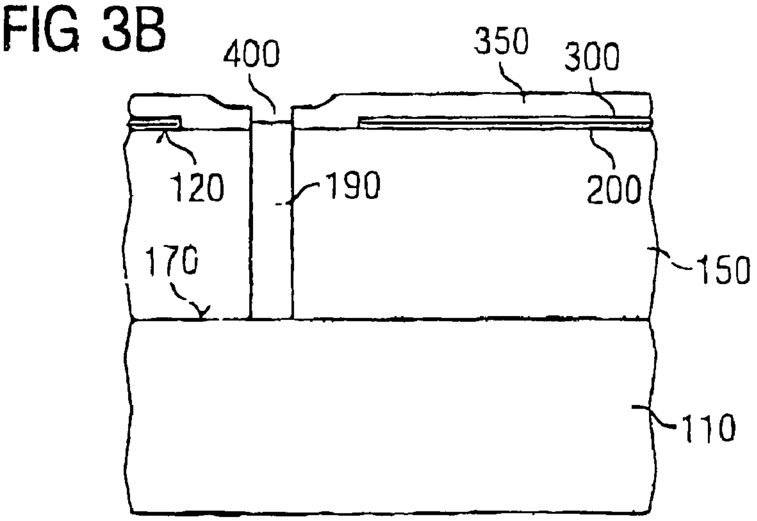
Figure 3C:
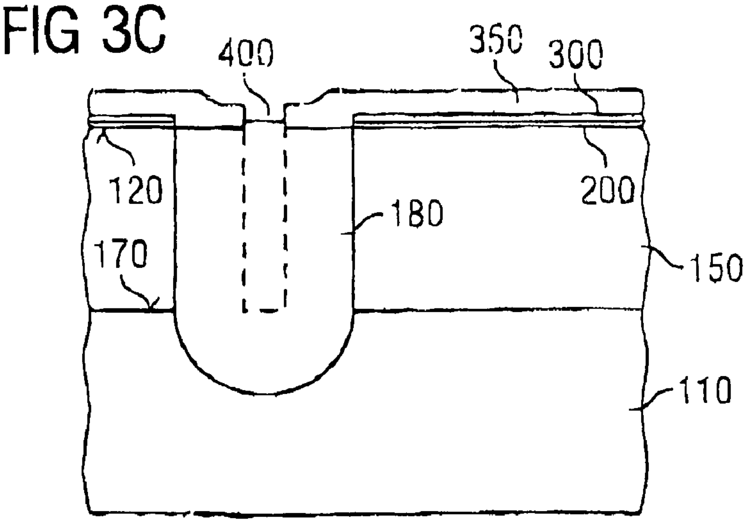
Figure 3D:
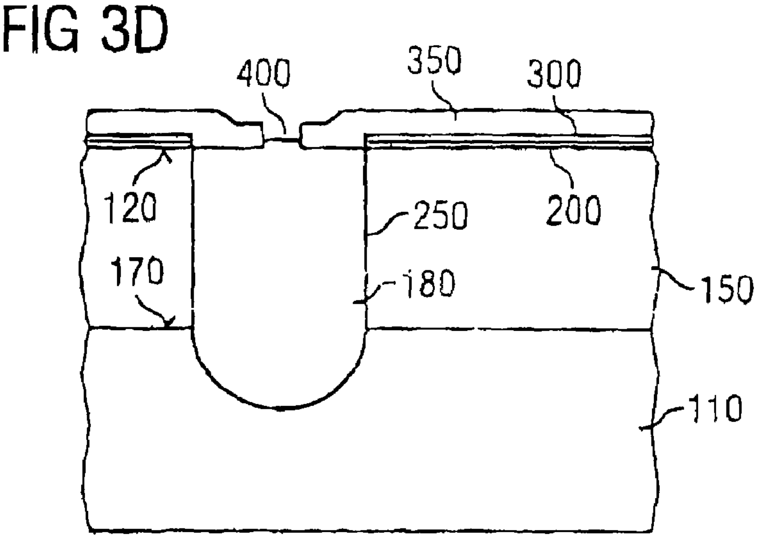
Figure 3E:
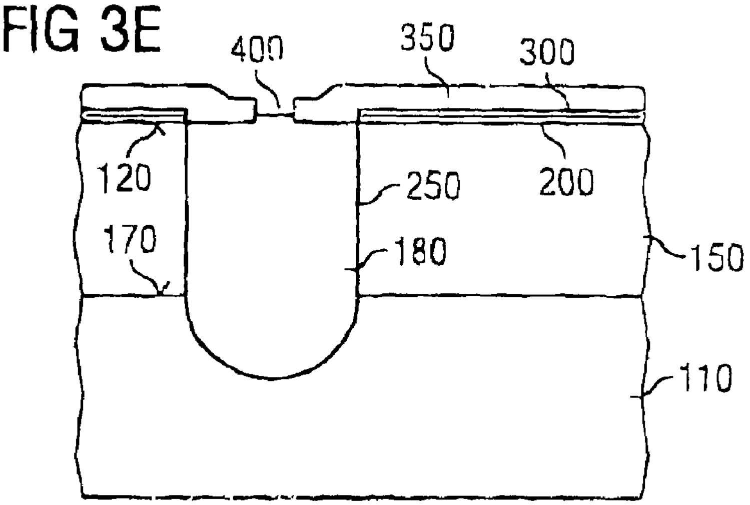
Figure 3F:
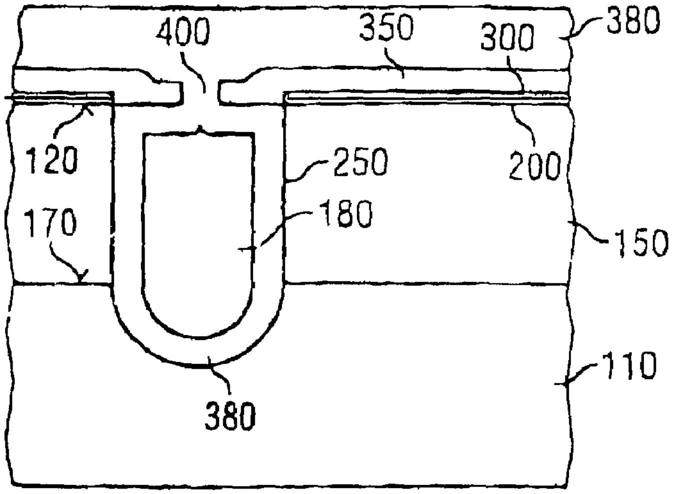
Figure 3G:
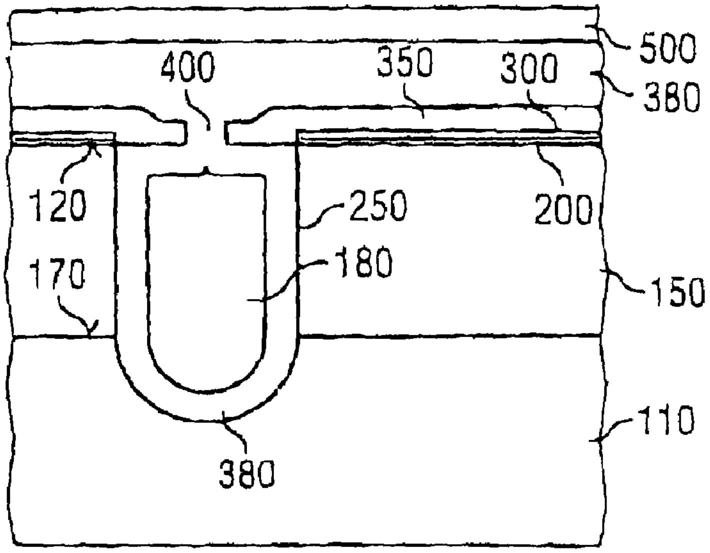
Figure 3H:
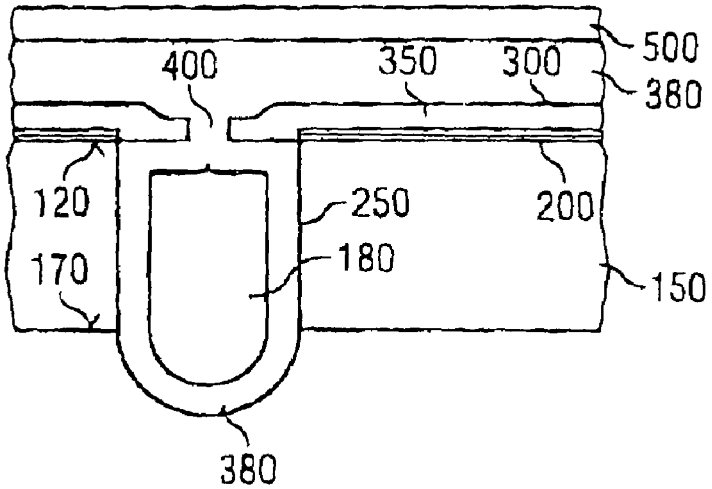
Figure 3I:
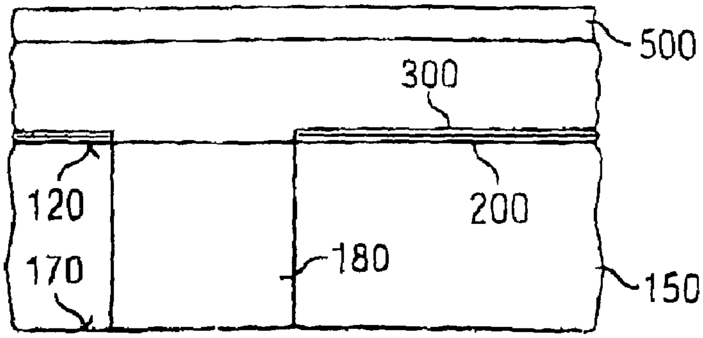

In a diagram FIG. 2 shows the dependence of the microphone sensitivity on the hole diameter of the perforation openings 20 plotted over the frequency using 6 curves.

A first curve 40 shows an almost constant microphone sensitivity across the maximum bandwidth of the frequency response with a hole diameter of 8 μm, while the second, third, and forth curves 37, 38, and 39 with a smaller hole diameter of 1 μm or 2 μm or 4 μm, respectively, and the fifth and sixth curves 41 and 42 with a larger hole diameter of 16 μm or 32 μm, respectively, show a clearly worse microphone sensitivity at higher frequencies. In all cases, the perforation area is respectively approx. 25% of the overall face of the counter-electrode 14 (see FIG. 1, dashed zone).

In FIG. 3, a number of successively running technology steps a) to i) when manufacturing a single perforation opening in a one-chip microphone are illustrated.

In the first step a) using epitaxy an approx. 5 μm thick layer 150 is applied to a silicon substrate 110. On this layer 150 first of all an insulating layer 200 covering the complete surface 120 of the layer 150 and on top of that a patterned electrically conductive layer 300 are applied. Subsequently, over the insulating layer 200 and the electrically conductive layer 300 a mask layer 350 is applied and patterned such that it comprises small openings 400 at the location where the mask layer 350 directly covers the insulating layer 200. Preferably, this mask layer 350 is an oxide.

In the second step b) using a dry etching process a hole 190 is etched through the insulating layer 200 and into the layer 150 approximately up to the interface of layer 150 and substrate 110.

In the third step c), then by a selective isotropic etching process, the hole 190 is expanded to the desired final diameter of 5 μm below the mask layer 350. Thereby, the perforation opening 180 results. The etching process may preferably be either dry-chemical or wet-chemical.

In a forth step d) now the overall surface and the perforation opening 180 is provided with a thin dielectric layer 250.

In a fifth step e) using a dry etching method the dielectric layer 250 is selectively removed on the surface of the mask layer 350 so that this dielectric layer 250 only remains at the surface of the perforation opening 180.

In a sixth step f), now a sacrificial layer 380, preferably an oxide sacrificial layer, is deposited. This deposition causes the perforation opening 180 to be lined with a layer until the small opening 400 in the mask layer 350 is closed. The deposition of the sacrificial layer 380 takes place until the thickness of the sacrificial layer 380 has reached the desired value. In this process, the surface of the wafer is almost completely planarized, so that subsequent processes may be performed with conventional means of semiconductor technology. When using a material as a sacrificial layer 380 which is etch-resistant against the silicon substrate 110, the forth and fifth step d) and e) may be omitted.

In a seventh step g) the membrane 500 is deposited onto the sacrificial layer 380. In further steps which are not important for the explanation of the embodiment and therefore omitted here, any other processes required for the manufacturing of a functional one-chip microphone are performed, for example for forming the terminals 24 and 26.

In an eighth step h), the silicon substrate 110 is removed in the area below the membrane 500 using so-called volume micromechanics. This process is selectively against the layer 150 and against the lining of the perforation opening 180. This way, the surface 170 of the layer 150 facing the substrate 110 is exposed.

In a final step i) the insulating layer 200, the possibly present dielectrics layer 250, the sacrificial layer 380 and the mask layer 350 are wet- or dry-chemically removed in so far that by doing this the perforation opening 180 is opened and a cavity 450 results between the surface 120 and the membrane 500.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A micromechanical capacitive converter, comprising:

a) a movable membrane;

b) a substrate; and c) a carrier layer being arranged between the substrate and the moveable membrane, wherein an electrically conductive face element is arranged on the carrier layer so that a cavity is positioned between the moveable membrane and the electrically conductive face element and the electrically conductive face element faces the moveable membrane via the cavity, wherein the carrier layer and the electrically conductive face element are perforated by perforation openings, wherein the smallest opening width of the perforation openings corresponds to more than double the distance between the membrane and the electrically conductive face element, an opening being formed in the substrate so that a part of a side of the carrier layer that abuts the substrate is exposed so as to allow a fluidic connection between the cavity and the opening via the perforation openings.

2. The micromechanical capacitive converter according to claim 1, the electrically conductive face element is arranged on the carrier layer.

3. The micromechanical capacitive converter according to claim 1, wherein the smallest opening width of the perforation openings is more than 2 μm.

4. The micromechanical capacitive converter according to claim 1, the perforation openings occupy 10 to 50% of an overall interface between the cavity and the electrically conductive face element.

5. The micromechanical capacitive converter according to claim 1, wherein the micromechanical capacitive converter comprises a sensor.

6. The micromechanical capacitive converter according to claim 5, wherein the sensor comprises a one-chip microphone.

7. The micromechanical capacitive converter of claim 1 wherein the micromechanical capacitive converter comprises a sensor.

8. The micromechanical capacitive converter of claim 7 wherein the sensor comprises a one-chip microphone.

9. A micromechanical capacitive converter comprising:

a) a moveable membrane;

b) a substrate; and c) a carrier layer arranged between the substrate and the moveable membrane, wherein a doped area of the carrier layer forms a counter-electrode so that a cavity is positioned between the moveable membrane and the counter-electrode and the counter-electrode faces the moveable membrane via the cavity, wherein the carrier layer and the counter-electrode are perforated by perforation openings, wherein a smallest opening width of the perforation openings corresponds to more than double the distance between the membrane and the counter-electrode, an opening being formed in the substrate so that a part of a side of the carrier layer that abuts the substrate is exposed so as to allow for a fluidic connection between the cavity and the opening via the perforation openings.

10. The micromechanical capacitive converter of claim 9 wherein at least some of the perforations have an opening width that approximately corresponds to a thickness of the carrier layer.

11. The micromechanical capacitive converter of claim 9 wherein the perforations have a hole diameter between 2 μm and 32 μm.

12. The micromechanical capacitive converter of claim 9 wherein the perforations occupy 25% of an overall interface between the cavity and the counter-electrode.

13. The micromechanical capacitive converter of claim 9 wherein the smallest opening width of the perforations is larger than 2 μm.

14. The micromechanical capacitive converter of claim 9 wherein the perforations occupy 10 to 50% of an overall interface between the cavity and the counter-electrode.

* * * * *